(12) United States Patent
Tsai et al.

(10) Patent No.: US 7,208,104 B2
(45) Date of Patent: Apr. 24, 2007

(54) MIXTURE SOLUTION FOR PREPARING A CONDUCTIVE POLYMER TO PRODUCE SOLID ELECTROLYTIC CAPACITORS AND ITS METHOD

(75) Inventors: Li-Duan Tsai, Hsinchu (TW); Yi-Chang Du, Hsinchu (TW)

(73) Assignee: Industrial Technology Research Institute Material Research Laboratories, Hsinchu (TW)

( * ) Notice: Subject to any disclaimer, the term of this patent is extended or adjusted under 35 U.S.C. 154(b) by 445 days.

(21) Appl. No.: 10/712,045

(22) Filed: Nov. 14, 2003

(65) Prior Publication Data

US 2004/0169163 A1   Sep. 2, 2004

(30) Foreign Application Priority Data

Dec. 17, 2002   (TW) ................ 91136357 A

(51) Int. Cl.
*H01G 9/00* (2006.01)
*H01B 1/06* (2006.01)

(52) U.S. Cl. ............ 252/500; 252/62.2; 252/519.31; 361/523; 361/524; 361/525; 361/526; 361/527; 361/528; 361/529; 29/25.03; 528/307; 528/403; 528/423

(58) Field of Classification Search ........ 252/500, 252/511, 62.2; 361/523–529; 29/25.03; 528/307, 403, 423
See application file for complete search history.

(56) References Cited

U.S. PATENT DOCUMENTS 4,803,596 A   2/1989 Hellwig et al.
4,910,645 A   3/1990 Jonas et al.
5,174,867 A * 12/1992 Naarmann et al. .......... 205/419
6,001,281 A * 12/1999 Lessner et al. ............. 252/500
6,056,899 A   5/2000 Lessner et al.

FOREIGN PATENT DOCUMENTS

JP   06-112094   * 4/1994

* cited by examiner

*Primary Examiner*—Mark Kopec
*Assistant Examiner*—Kallambella Vijayakumar
(74) *Attorney, Agent, or Firm*—Birch, Stewart, Kolasch & Birch, LLP

(57) ABSTRACT

A mixture solution for preparing conducting polymers. The conducting polymer is formed from a mixture of monomer and oxidant solution. The oxidant solution has a high concentration, and also includes a five or six-member ring compound with a functional group

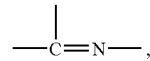

which acts as a retardant for the polymerization. Thus, the mixture of a monomer and oxidant solution exhibits excellent stability at room temperature. The conducting polymer accumulating in the space of the capacitor element can be more efficiently formed by using this high concentration oxidant solution. Therefore, the immersion and polymerization processes to form conducting polymer as the electrolyte of a solid electrolytic capacitor can be limited to only a few occurrences.

20 Claims, 4 Drawing Sheets

| No | EDT | Fe(III) tosylate | methanol | THF | Imidazole | 2-methyl imidazole | 1,2,4-triazole | pyridine |
|---|---|---|---|---|---|---|---|---|
| 1 | 0.4 | 1.6 | 0.86 | | | | | |
| 2 | 0.4 | 1.6 | 0.86 | 0.808 | | | | |
| 3 | 0.4 | 1.6 | 0.86 | | 0.191 | | | |
| 4 | 0.4 | 1.6 | 0.86 | | | 0.231 | | |
| 5 | 0.4 | 1.6 | 0.86 | | | | 0.194 | |
| 6 | 0.4 | 1.6 | 0.86 | | | | | 0.222 |

Fig. 2

| | Capacity (μF) | 100kHz ESR (mΩ) | Leaking Current (μA) |
|---|---|---|---|
| Embodiment 2 | 359 | 18 | 14.8 |
| Embodiment 3 | 360 | 18 | 15.6 |
| Embodiment 4 | 356 | 16 | 49.1 |
| Embodiment 5 | 355 | 24 | 10.8 |
| Comparative Embodiment 1 | 334 | 68 | 84.1 |
| Comparative Embodiment 2 | ND* | ND* | — |

*ND: Non-detected

Fig. 4

MIXTURE SOLUTION FOR PREPARING A CONDUCTIVE POLYMER TO PRODUCE SOLID ELECTROLYTIC CAPACITORS AND ITS METHOD

This nonprovisional application claims priority under 35 U.S.C. § 119(a) of Patent Application No. 91136357 filed in Taiwan, R.O.C. on Dec. 17, 2002, the entire contents of which are hereby incorporated by reference.

BACKGROUND OF THE INVENTION

1. Field of Invention

The invention relates to a mixture solution for preparing a conductive polymer to produce a solid-state electrolytic capacitor. The conducting polymer is formed from the mixture of monomer and oxidant solution. Particularly, the oxidant solution is high concentration, and is also added a five or six-member ring compound with a functional group

which acts as a retardant for the polymerization.

2. Related Art

For a long time, the development of electrolytic capacitors has been focusing on improving the conductivity of electrolyte so as to reduce the equivalent series resistance (ESR) and impedance and improve the reliability of capacitors. Because conductive polymer has higher conductivity than liquid-state electrolyte or solid-state organic semiconductor complex salt (such as TCNQ complex salt) and it becomes insulator in higher temperature, it is perfectly used as the electrolyte of electrolytic capacitors.

In U.S. Pat. No. 4,803,596, Gerhard Hellwig, Stegen et al. first disclosed that conductive polymer would be used as the electrolyte of an electrolytic capacitor. After the positive foil of an electrolytic capacitor is dropped with the monomer and oxidant solution, respectively, the monomer polymerizes by the oxidant under proper condition. By this method, however, the conductive polymer monomer is not fully mixed with the oxidant, so the reaction is not uniform.

Therefore the method for producing conductive polymer electrolytes of solid-state electrolytic capacitors is improved by mixing conductive polymer monomer with dopant, oxidant and solvent, and then making the capacitor element impregnated with such the mixture solution. Finally the monomer absorbed in the element converts into conductive polymer. If the reactivity of the oxidant in the mixture is not inhibited, however, the conductive polymer monomer polymerizes as soon as it mixes with the oxidant. As a result, the mixture solution is unable to permeate into the pores of the capacitor element.

Friedrich Jonas et al. disclosed in U.S. Pat. No. 4,910,645 a series of specific polythiophenes can apply to the electrolyte of solid state electrolytic capacitors. The method is simply to dip the capacitor element in the mixture of thiophene monomer and oxidant solution without polymerization retardant and then thiophene monomer polymerize at high temperature. Unfortunately, the stability of the mixture of the thiophene monomer and oxidant solution at room temperature decreases with the high concentration both of the monomer and oxidant. Therefore the proposed method uses a large amount of solvent to dilute the monomer and oxidant. As a consequence, when a capacitor element is impregnated with the mixture solution, it only obtains a little conductive polymer, and the rest is the remaining reagent and a large amount of solvent. Multiple steps of impregnation and polymerization processes are required by this method in order to produce enough conductive polymer to fill the space in a capacitor element.

Phipip M. Lessner et al. disclosed in U.S. Pat. No. 6,056,899 a process that uses a kind of of cyclic ethers (such as tetrahydrofuran) to mix with an oxidant of ferric ion to produce a complex, reducing the oxidation ability of the oxidant so that the mixture solution of the conductive polymer monomers and oxidant is kept stable for a long period of time. After the capacitor element is impregnated with the mixture solution, the cyclic ether is evaporated at a higher temperature to make the oxidant induce a polymerization of conductive polymer. Because the cyclic ethers disclosed in the invention (such as tetrahydrofuran) have little ability as a polymerization retarder to stabilize the mixture solution of monomer and oxidant, a large amount of such cyclic ether is consumed in order for it to stabilize the mixture solution and, at the same time, dilutes the mixture solution of conductive polymer monomer and oxidant. As a result, a capacitor element still needs to be impregnated and polymerized many times to acquire a sufficient amount. Thus, this patent still has the shorcomings of fabricating solid-state electrolytic capacitors by a complicated process.

SUMMARY OF THE INVENTION

To solve the aforesaid problems, the present invention provides a simple method for forming conductive polymer as the electrolyte of a solid-state electrolytic capacitor. The main object is to use the simple process steps of impregnation and polymerization to obtain conducting polymer as the electrolyte of a solid electrolytic capacitor. By this invention, a solid-state electrolytic capacitor exhibiting excellent capacitor characteristics is acquired.

The invention provides a mixture solution and its method for preparing the conductive polymer to produce a solid-state electrolytic capacitor. The method is that polymerization retarder is added into a high concentration oxidant solution in advance, to reduce the oxiding ability of the oxidant so that polymerization does not occur until the temperature is higher than that of impregnation. Specifically, polymerization retarder is a kind of five- or six-member ring compound with a functional group

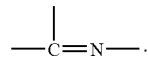

The five- or six-member ring compounds having a functional group

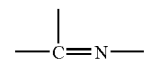

are more effective in stabilizing the mixture solution of monomer and oxidant than cyclic ethers. Accordingly, the amount of the five- or six-member ring compounds having a functional group

in the oxidant solution is minor and will not obviously dilute the mixture solution. In addition, the solvent used in this oxidant solution, such as methanol, is highly soluble to the oxidant containing ferric ion, so that the amount of the solvent in the mixture solution can be limited in a minor proportionation. As a consequence, the mixture of conducting polymer monomer and oxidant solution has good stability at room temperature, and there is sufficient time to impregnate a capacitor element with the mixture solution. Finally, the majority of the absorbed mixture solution in the impregnated capacitor element converts into conducting polymer, because the retardant and solvent in the mixture solution are in a tiny minority. Therefore, the steps of the impregnation and polymerization of conducting polymer as the electrolyte of a solid electrolytic capacitor are reduced.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2 is a composition (wt) table of different mixture solutions;

FIG. 4 is a table illustrating capacitor characteristics of different embodiments of the invention.

DESCRIPTION OF THE PREFERRED EMBODIMENT

Figure 1:
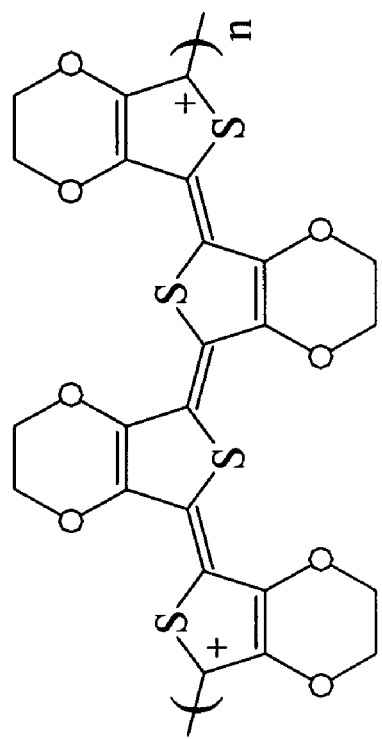
FIG. 1 is the illustration of the polymerization of 3, 4-ethylenedioxythiophene, chemically oxidized by Fe(III) tosylate.
Figure 1:
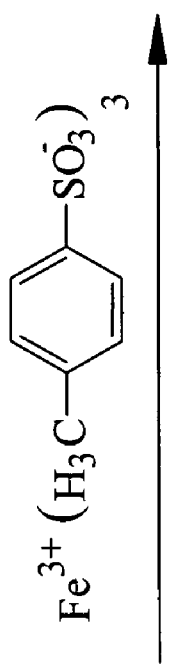
Figure 1:
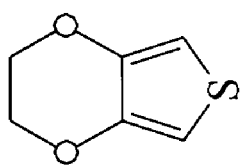

Polyaniline, polypyrrole, polythiophene and their derivatives, such as poly(3, 4-ethylenedioxythiophene) are common commercial conductive polymers and are widely used as the electrolyte of solid electrolytic capacitors. FIG. 1 illustrates the chemical polymerization of 3, 4-ethylenedioxythiophene (EDT) that uses Fe(III) tosylate as oxidant, which oxides EDT to produce poly(3, 4-ethylenedioxythiophene) and toluenesulfonic acid at the same time. Toluenesulfonic acid dopes poly(3, 4-ethylenedioxythiophene).

Fe(III) tosylate as an oxidant in this invention, like other ferric oxidants, is solid and is proper to be used after dissolved in solvent. In the invention, the solvent that dissolves the oxidant may be alcohol, acetone, water, or any mixtures containing any of these. To reduce the proportion of solvent in the mixture solution of monomers and oxidant solution, the best result is obtained when the concentration of oxidant reaches over 50 wt % in the mixture solution.

In addition to Fe(III) tosylate, ferric sulfonic acid, ferric perchloride and ferric chloride, the residual of which itself may act as a dopant, and other oxidants such as ammonium persulfate need dopants to make poly 3, 4-ethylenedioxythiophene exhibit high conductivity. The usual dopants include $AsF_6^-$, $BF_4^-$, $PF_6^-$, I and single proton or multi-proton acid, such as sulfuric acid, phosphoric acid, citric acid, perchloric acid, and relevant derivatives or salts, e.g. polystylene sulfonic acid (PSS).

Besides relating to the oxidation potential of the monomer, the oxidation polymerizing reaction of the conductive polymer monomer is also affected by the oxidizing capability of the oxidant. For the oxidant containing ferric ion, the oxidizing capability of the ferric ion may decay when it forms a complex with specific molecules. Therefore, the stronger the complex bonding is, the lesser the oxidizing capability of the oxidant.

The invention uses a compound of a five-member or six-member ring with a functional group

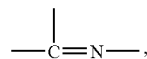

which produces complex bonding with ferric ions of the oxidant to reduce the oxidizing capability of the oxidant with ferric ion at room temperature. As a result, the mixture of monomer and oxidant is stable at room temperature, even if the amount of the solvent in the mixture is tiny. The oxidant which forms a complex with the said polymerization retardant can still oxidize the monomer to produce conducting polymer in a high temperature environment. The compound of a five-member ring with functional group

can form stronger complex bonding with ferric ion than that of oxygen-containing compounds. Therefore, only a small amount of the compound of a five-member ring with a functional group

has a higher efficiency to retard the oxidizing capability of the oxidant containing ferric ion at room temperature. For the oxidant containing ferric ion, its complexes with a six-member ring with a functional group

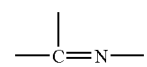

has the strongest complex bonding. The mixture solution of the monomer and oxidant is made by mixing the high concentration oxidant with a small amount of polymerizing retardant, which has a five-member or six-member ring with a functional group

for which the monomer and oxidant are main components. The element of the capacitor not only has adequate impregnating time but also acquires conductive polyelectrolytes with sufficient thickness in the limited impregnating times. Thus conductive polymer electrolytes of solid-state electrolytic capacitors with excellent performance are produced.

The object of the invention is to add a polymerization retardant with a five-member of six-member ring compound with a functional group

in the high concentration oxidant solution to prevent the monomer from immediately reacting when mixing the oxidant solution with the conductive polymer monomer at room temperature. A capacitor element is then impregnated in the mixture solution, and conductive polymer forms at a higher temperature later. In such a way, the high concentration oxidant solution can be used, eliminating the disadvantage that the capacitor needs multiple impregnation and polymerization processes to form electrolytes of adequate thickness. The method also offers adequate impregnation time for capacitor elements and produces conductive polymer electrolytes that deeply penetrate into the micropores of the element foil. Thus, capacitor elements acquire polymer electrolytes of adequate thickness and excellent performance after being impregnated with the mixture solution and making a polymerization in only a few times.

At room temperature or slightly higher, the invention can properly reduce the oxidizing capability of the oxidant containing ferric ion. Five-member ring compounds (with functional group

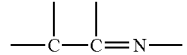

such as imidazole, 2-methylimidazole, pyrazole, triazole, pyridine and pyridazine, as well as their derivatives, may stabilize the mixture solution of the conductive polymer monomer and oxidant which acts as the polymerizing retardant for conductive polymer monomer. Since the complex capability of imidazole, 2-methylimidazole, pyrazole, triazole and their derivatives is much greater with ferric ion than that of compounds containing oxygen, only a small amount of any one of imidazole, 2-methylimidazole, pyrazole, triazole or their derivatives is required to reduce the oxidizing capability of ferric oxidant at room temperature. By adding the six-member ring compound containing a functional group

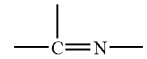

which has stronger complex capability with ferreous oxidant, such as pyridine, pyridazine or 1,2-diazine and their derivatives, conductive polymer electrolytes with high electrical conductivity and high stability are also produced. The mixture solution of monomer and oxidant (these are the main components) is made by mixing high concentration oxidant with a little polymerization retardant so that the capacitor element not only has enough time for impregnation, but also acquires an adequate thickness of conductive polymer electrolytes. Thus, conductive polymer of solid-state electrolytic capacitors with excellent performance are produced.

The following is a detailed description of the technology required for achieving the objectives of the invention:

Embodiment 1

In order to compare the long-term stability of the mixture solutions containing different retardants, the six different mixture solutions of EDT monomer, Fe(III) tosylate solution and different polymerization retardants are made according to Table in FIG. 2. The changes of specific viscosity of these six mixture solutions over time are measured at room temperature (25° C.). The results are listed in FIG. 3.

Figure 3:
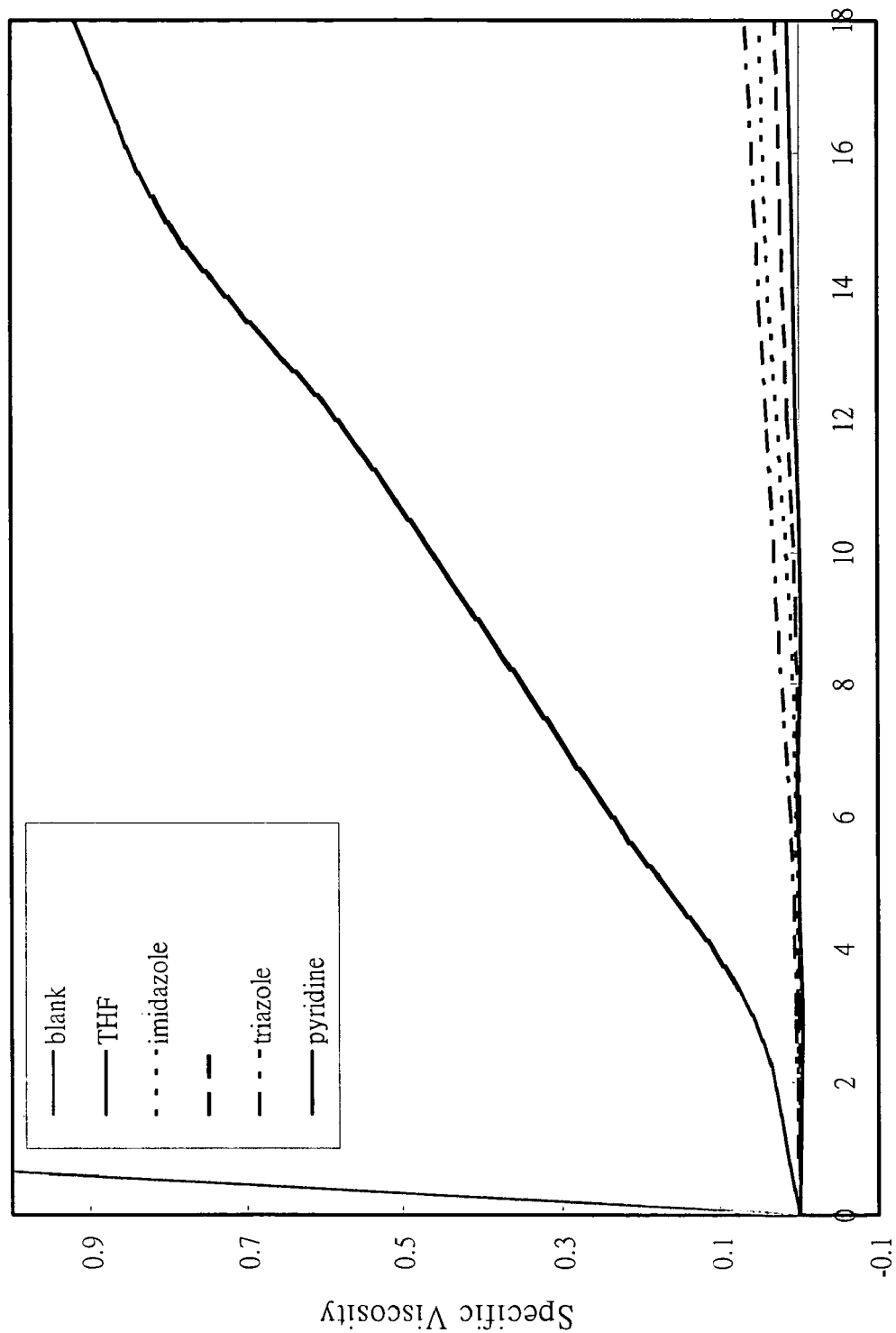
FIG. 3 is a figure of the specific viscosity versus time for the mixture solution of 3, 4-ethylenedioxythiophene and various oxidants at room temperature.

The results in FIG. 3 show that the mixture solution of EDT monomer and Fe(III) tosylate solution without any polymerization retardant is most unstable in these six mixture solutions. The specific viscosity of such the mixture solution increases quickly, showing that the polymerization is occurring rapidly, and the capacitor element does not have enough time for impregnation with such an unstable mixture solution. Although the oxidant solution containing tetrahydrofuran (THF) can slightly delay polymerization of monomers in the mixture solution, the amount of tetrahydrofuran which is required is much more than the four retardants above: imidazole, 2-methylimidazole, triazole and pyridine. Conversely, the variations of specific viscosity of all the mixture solutions containing the reductants of five- or six-member ring with the functional group of

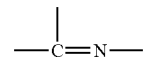

are not very obvious during the measuring period of time, which shows that such the mixture solutions exhibit better stability at room temperature and a capacitor can be impregnated sufficiently in such mixture solutions.

Embodiment 2

An anode aluminum foil, a cathode aluminum foil and Manila paper are wound together to prepare a capacitor element. The element is impregnated in a mixture solution composed of EDT monomer, Fe(III) tosylat solution and imidazole. The proportions of the ingredients in the mixture solution are listed in Table in FIG. 2. The capacitor element sucking the mixture solution is heated at 100° C. for 10 minutes. After two times of impregnation and polymerization, the capacitor element is cleaned up with methanol and dried at 100° C. Then the capacitor element is set into an aluminum metallic case and sealed with a rubber member. After the aging process is completed, a winding type aluminum solid state electrolytic capacitor is produced. For the features of the capacitor according to this Embodiment refer to FIG. 4.

Embodiment 3

In the same manner of Embodiment 2, an anode aluminum foil, a cathode aluminum foil and Manila paper are wound together to prepare a capacitor element. The element is impregnated in a mixture solution composed of EDT monomer, Fe(III) tosylat solution and 2-methyl imidazole. The proportions of the ingredients in the mixture solution are listed in Table in FIG. 2. The capacitor element sucking the mixture solution is heated at 100° C. for 10 minutes. After two times of impregnation and polymerization, the capacitor element is cleaned up with methanol and dried at 100° C. Then the capacitor element is set into an aluminum metallic case and sealed with a rubber member. After the aging process is completed, a winding type aluminum solid state electrolytic capacitor is produced. For the features of the capacitor according to this Embodiment refer to FIG. 4.

Embodiment 4

In the same manner of Embodiment 2, an anode aluminum foil, a cathode aluminum foil and Manila paper are wound together to prepare a capacitor element. The element is impregnated in a mixture solution composed of EDT monomer, Fe(III) tosylat solution and trazole. The proportions of the ingredients in the mixture solution are listed in Table in FIG. 2. The capacitor element sucking the mixture solution is heated at 100° C. for 10 minutes. After two times of impregnation and polymerization, the capacitor element is cleaned up with methanol and dried at 100° C. Then the capacitor element is set into an aluminum metallic case and sealed with a rubber member. After the aging process is completed, a winding type aluminum solid state electrolytic capacitor is produced. For the features of the capacitor according to this Embodiment refer to FIG. 4.

Embodiment 5

In the same manner of Embodiment 2, an anode aluminum foil, a cathode aluminum foil and Manila paper are wound together to prepare an capacitor element. The element is impregnated in a mixture solution composed of EDT monomer, Fe(III) tosylat solution and pyridine. The proportions of the ingredients in the mixture solution are listed in Table in FIG. 2. The capacitor element sucking the mixture solution is heated at 100° C. for 10 minutes. After two times of impregnation and polymerization, the capacitor element is cleaned up with methanol and dried at 100° C. Then the capacitor element is set into an aluminum metallic case and sealed with a rubber member. After the aging process is completed, a winding type aluminum solid state electrolytic capacitor is produced. For the features of the capacitor according to this Embodiment, refer to FIG. 4.

Comparative Embodiment 1

After the Fe(III) tosylate constituting the mixture solution listed in the second set of FIG. 2 is dissolved with methanol and mixed with tetrahydrofuran, it is mixed with EDT monomer. Finally, the mixture solution is impregnated with the capacitor element. The impregnating mixture solution sucked by the capacitor element reacts for 10 minutes at 100° C. After two times of impregnating and reaction, the capacitor element is cleaned up with methanol and dried at 100° C. The capacitor element is set into an aluminium metallic case and sealed with a rubber member. Finally, aging is carried out to mend the dielectric layer of the capacitor foil, and the capacitor is thus produced completely.

Refer to FIG. 4 for characteristics of the capacitor according to this comparative Embodiment. Because there is a great deal of tetrahydrofuran in the mixture solution, fewer conductive polymers are to be acquired. Accordingly, with the same impregnating times, the conductive polymer electrolytes acquired by the capacitor element being immersed in this type of mixture solution are unable to fill the entire space of the capacitor element, which is obviously not as good as the embodiments described above.

Comparative Embodiment 2

Refer to the sixth set of mixture solution in FIG. 2 for the amount of Fe(III) tosylate, methanol and EDT monomer in this Embodiment, among which only the amount of pyridine is increased to 0.266 g. This mixture solution is then put into the element formed according to the specifications of the second embodiment of the invention, and allowed to react for 10 minutes at 100° C. Consequently, the mixture solution sucked by the element converts into brown gel and, as such, the capacitor has no capacity. Because the amount of pyridine in this mixture solution is higher than in the Embodiment 4, the retard effect of pyridine on the oxidant is so much stronger that the EDT monomer in the mixture solution cannot convert into conductive polymer due to insufficient oxidizing of the oxidant.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A mixture solution for preparing a conductive polymer to produce a solid electrolytic capacitor, comprising:

a conductive polymer monomer, a transition metal oxidant solution with a concentration of higher than 50 wt %, and a polymerization retardant having one of five-member ring and six-member ring compounds with a functional group

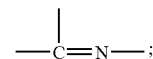

and wherein the retardant preventing the mixture of the oxidant and the conductive polymer monomer from polymerization under a room temperature, and the capacitor element is fully immersed in the mixture solution, the conductive polymer polymerizes under a temperature higher than the room temperature.

2. The mixture solution of claim 1, wherein the conductive polymer monomer is selected from the group consisting of thiophene, pyrrole, phenylvinylene, aniline, their derivations and combinations.

3. The mixture solution of claim 2, wherein the conductive polymer monomer is 3,4-ethylenedioxythiophene.

4. The mixture solution of claim 1, wherein the transition metal oxidant solution is a ferric oxidant solution.

5. The mixture solution of claim 4, wherein the ferric oxidant solution is selected from the group consisting of Fe(III) tosylate, Fe(III) sulfate, Fe(III) perchloride, and Fe(III) chloride and mixed oxidants containing any of these ferric compounds.

6. The mixture solution of claim 1, wherein the polymerization retardant is selected from the group consisting of imidazole, 2-methylimidazole, pyrazole, triazole, pyridine, pyridazine, their derivations and combinations.

7. The mixture solution of claim 1, wherein solvent of the transition metal oxidant solution is selected from the group consisting of alcohol, ketone, water, and mixtures containing any of these solvents.

8. The transition metal oxidant solution of claim 7, wherein solvent is selected from methanol, isopropanol, acetone, water, and mixture containing any of these solvents.

9. The mixture solution of claim 1, wherein the molar ratio of polymerization retardant to the oxidant ranges from 0.1 to 2.

10. The mixture solution of claim 1, wherein further comprises a dopant and the dopant is selected from the group consisting of toluenesulfonic acid, sulfonated compounds, ferric chloride ($FeCl_3$), $BF_4^-$, $PF_6^-$, iodine (I), sulfuric acid ($H_2SO_4$), phosphoric acid ($H_3PO_4$), citric acid, hydrochloric acid (HCl), perchloric acid ($HClO_4$), their derivations and combinations.

11. A method for preparing a conductive polymer to produce a solid electrolytic capacitor, comprising:
    providing a mixture solution composing a conductive polymer monomer, a transition metal oxidant solution with a concentration of higher than 50 wt %, and a polymerization retardant having one of five-ring and six-ring compounds with a functional group

wherein the retardant preventing the oxidant and the conductive polymer monomer from polymerization at room temperature;
    immersing a capacitor element into this mixture solution at room temperature; and
    raising the temperature of the mixture solution to accelerate the polymerization of the conductive polymer monomer.

12. The method of claim 11, wherein the conductive polymer monomer is selected from the group consisting of thiophene, pyrrole, phenylvinylene, aniline, their derivations and mixtures containing any of these monomers.

13. The method of claim 11, wherein the conductive polymer monomer is 3, 4-ethylenedioxythiophene.

14. The method of claim 11, wherein the transition metal oxidant solution is a ferric oxidant solution.

15. The method of claim 14, wherein the ferric oxidant solution is selected from the group consisting of Fe(III) tosylate, Fe(III) sulfonate, Fe(III) perchloride, and Fe(III) chloride.

16. The method of claim 11, wherein the polymerization retardant is selected from the group consisting of imidazole, 2-methylimidazole, pyrazole, triazole and pyridazine, their derivations and mixtures containing any of these compounds.

17. The method of claim 11, wherein solvent of the transition metal oxidant solution is selected from alcohol, ketone, water and mixtures containing any of these monomers.

18. The method of claim 17, wherein the solvent is selected from the group consisting of methanol, isopropanol, acetone, water, and mixtures containing any of these monomers.

19. The method of claim 11, wherein molar ratio of the polymerization retardant to the oxidant ranges from 0.1 to 2.

20. The method of claim 11, further comprises a dopant and the dopant is selected from the group consisting of toluenesulfonic acid, sulfonated compounds, ferric chloride ($FeCl_3$), $BF_4^-$, $PF_6^-$, iodine (I), sulfuric acid ($H_2SO_4$), phosphoric acid ($H_3PO_4$), citric acid, hydrochloric acid (HCl), perchloric acid ($HClO_4$), their derivations and the combinations having any of these dopants.

* * * * *